US011619676B2

(12) United States Patent
Malloy et al.

(10) Patent No.: US 11,619,676 B2
(45) Date of Patent: *Apr. 4, 2023

(54) SYSTEMS AND METHODS FOR DETERMINING VEHICLE BATTERY HEALTH

(71) Applicant: Cox Automotive, Inc., Atlanta, GA (US)

(72) Inventors: Lea Malloy, Atlanta, GA (US); Mark Humble, Nashville, TN (US)

(73) Assignee: COX AUTOMOTIVE, INC., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/163,041

(22) Filed: Jan. 29, 2021

(65) Prior Publication Data

US 2021/0148989 A1 May 20, 2021

Related U.S. Application Data

(63) Continuation of application No. 16/917,660, filed on Jun. 30, 2020, now Pat. No. 10,942,223.

(Continued)

(51) Int. Cl.
*G01R 31/392* (2019.01)
*G01R 31/367* (2019.01)
*H01M 50/572* (2021.01)

(52) U.S. Cl.
CPC ........ *G01R 31/392* (2019.01); *G01R 31/367* (2019.01); *H01M 50/572* (2021.01); *H01M 2220/20* (2013.01)

(58) Field of Classification Search
CPC . G01R 31/392; G01R 31/367; H01M 50/572; H01M 2220/20; H01M 10/425;

(Continued)

(56) References Cited

U.S. PATENT DOCUMENTS 9,761,066 B2 * 9/2017 Chen .................. G01R 31/3835
10,942,223 B1 * 3/2021 Malloy ................. H01M 10/48

(Continued)

FOREIGN PATENT DOCUMENTS

WO 2019028451 A1 2/2019

OTHER PUBLICATIONS

Bergdolt, J., et al., "Battery Health Monitoring And Degradation Prognosis In Fleet Management", World Electric Vehicle Journal, vol. 9, No. 3, Aug. 29, 2018, 20 pages.

(Continued)

*Primary Examiner* — Manuel A Rivera Vargas
*Assistant Examiner* — Yaritza H Perez Bermudez
(74) *Attorney, Agent, or Firm* — Eversheds Sutherland (US) LLP

(57) ABSTRACT

The present disclosure relates to systems and methods for determining vehicle battery health. In some embodiments, an example method may include receiving, from a first vehicle, a first value for a first data type and a second value for a second data type, the first data type and the second data type relating to a battery of the first vehicle. The example method may also include determining, for the first data type and the second data type, a minimum possible value, a maximum possible value, and an offset indicator, wherein the offset indicator provides an indication of a significance of the first value and the second values relative to the minimum possible value and maximum possible value for the first data type and the second data type respectively. The example method may also include determining a weight for the first data type and a weight for the second data type. The example method may also include determining, based on the weight for the first data type and the weight for the second data type, a weighted value for the first value and a weighted value for the second value. The example method may also (Continued)

include determining a summed weighted value by summing the weighted value for the first value and the weighted value for the second value. The example method may also include determining, using the scaling the summed weighted value, a vehicle battery health score for the battery of the first vehicle.

20 Claims, 4 Drawing Sheets

Related U.S. Application Data

(60) Provisional application No. 62/881,104, filed on Jul. 31, 2019.

(58) Field of Classification Search
CPC ........ H01M 10/48; Y02T 10/70; Y02E 60/10; B60L 3/12; B60L 58/16
See application file for complete search history.

(56) References Cited

U.S. PATENT DOCUMENTS

| | | | | |
|---|---|---|---|---|
| 11,063,448 | B2* | 7/2021 | Klicpera | H02J 7/00036 |
| 2003/0184307 | A1* | 10/2003 | Kozlowski | B60L 58/16 |
| | | | | 324/427 |
| 2006/0076929 | A1* | 4/2006 | Tatsumi | G01R 31/3842 |
| | | | | 320/132 |
| 2009/0024266 | A1 | 1/2009 | Bertness et al. | |
| 2014/0049226 | A1* | 2/2014 | Mao | G01R 31/392 |
| | | | | 702/63 |
| 2015/0051855 | A1* | 2/2015 | Joe | G01R 31/382 |
| | | | | 702/63 |
| 2015/0064510 | A1* | 3/2015 | Wang | H01M 10/486 |
| | | | | 429/61 |
| 2015/0318724 | A1* | 11/2015 | Brockman | G01R 31/382 |
| | | | | 320/152 |
| 2015/0321572 | A1 | 11/2015 | Koch et al. | |
| 2016/0187428 | A1 | 6/2016 | Basu et al. | |
| 2017/0089985 | A1* | 3/2017 | Zafiridis | B60L 58/10 |
| 2018/0143257 | A1* | 5/2018 | Garcia | G01R 31/382 |
| 2018/0313900 | A1* | 11/2018 | Koga | B60L 3/12 |
| 2019/0004118 | A1 | 1/2019 | Eichelberger et al. | |
| 2019/0033395 | A1 | 1/2019 | Karner et al. | |
| 2019/0115629 | A1* | 4/2019 | Chen | H01M 10/482 |
| 2019/0311556 | A1* | 10/2019 | Thron | G07C 5/008 |
| 2020/0195017 | A1* | 6/2020 | Ahn | G01R 31/3842 |
| 2021/0181263 | A1* | 6/2021 | Hametner | G01R 31/374 |

OTHER PUBLICATIONS

Rezvanizaniani, SM, et al., "Review And Recent Advances In Battery Health Monitoring And Prognostics Technologies For Electric Vehicle (EV) Safety And Mobility", Journal of Power Sources, vol. 256, Jun. 15, 2014, pp. 110-124.

* cited by examiner

| | VIN Level Battery Data Points | Source | Value | Min | Max | Offset | MinRange | MaxRange | Note |
|---|---|---|---|---|---|---|---|---|---|
| System Level | OEM State Of Health (SOH) | BMS | 22.20 | | 900 | High | | | |
| | DOD % (Avg) | OEM Calculated | 69 | 2 | 500 | Low | | | |
| | DOD Amb Temp (Avg) | OEM Calculated | 45 | -25 | 150 | Range | 25 | 70 | |
| | DOD Throughput (kWh) | OEM Calculated | | | | Low | | | |
| | Charging Magnitude (Avg) | OEM Calculated | | | | Low | | | |
| | Charging Amb Temp (Avg) | OEM Calculated | | | | Range | 10 | 70 | |
| | Charging Throughput (kWh) | OEM Calculated | | | | Low | | | |
| | Total Throughput (kWh) | BMS | | | | Low | | | |
| | State Of Charge (SOC) | BMS | 60 | | | NA | | | |
| | Est Range at Full Charge | BMS/Calculated | 300 | | | NA | | | |
| | Est Range at Current Charge | BMS | 150 | | | NA | | | |
| | Range of Battery at Birth | OEM | 100 | | | NA | | | |
| | Battery Energy Capacity (kWh) | BMS | 200000 | 0 | 320000 | High | | | |
| Usage | Number of Fast Charge Cycles | BMS | 10 | | | Low | | | |
| | Number of L1 Charge Cycles | BMS | 250 | | | Low | | | |
| | Number of L2 Charge Cycles | BMS | 120 | 0 | 800 | Low | | | |

SYSTEMS AND METHODS FOR DETERMINING VEHICLE BATTERY HEALTH

CROSS-REFERENCE TO RELATED APPLICATIONS

The present disclosure claims priority to and is a continuation of U.S. application Ser. No. 16/917,660, filed Jun. 30, 2020, which claims benefit of U.S. Provisional application No. 62/881,104, filed Jul. 31, 2019, which are both incorporated herein by reference in their entirety.

TECHNICAL FIELD

The present disclosure relates to systems and methods for determining vehicle battery health, and more particularly, for determining a health score for a vehicle battery.

BACKGROUND

With the growing presence of electric vehicles (EV) within the marketplace, the secondary market for such vehicles will continue to grow as more used EVs are placed on sale. An important aspect of these EVs is the battery that is used to drive the EV. While some vehicle original equipment manufacturers (OEMs) may track and store a proprietary battery health score, such sores cannot be used for comparison across OEMs because of the proprietary nature of the OEM battery health scores.

BRIEF DESCRIPTION OF THE DRAWINGS

The detailed description is set forth with reference to the accompanying drawings. The use of the same reference numerals may indicate similar or identical items. Various embodiments may utilize elements and/or components other than those illustrated in the drawings, and some elements and/or components may not be present in various embodiments. Elements and/or components in the figures are not necessarily drawn to scale. Throughout this disclosure, depending on the context, singular and plural terminology may be used interchangeably.

FIG. 3 depicts exemplary data inputs, in accordance with one or more example embodiments of the disclosure.

DETAILED DESCRIPTION

Overview

Figure 1:
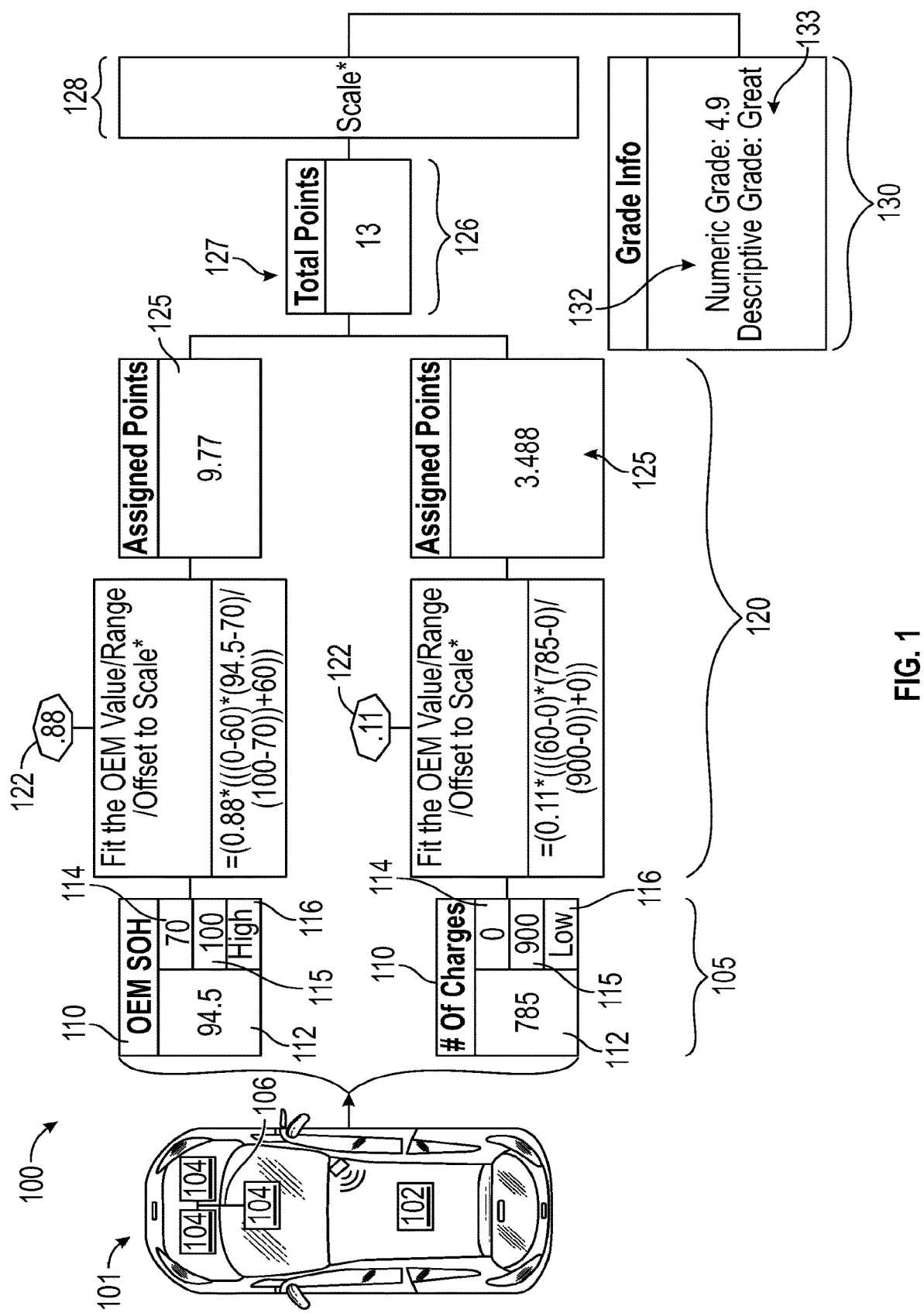
FIG. 1 depicts an example battery health score determination process, in accordance with one or more example embodiments of the disclosure.

The disclosure is directed to, among other things, systems and methods for determining vehicle battery health. In some embodiments, the disclosure may more particularly relate to determining an electric vehicle (EV) battery health score that may be normalized across different types of vehicles and different vehicle original equipment manufacturers (OEMs). Such normalized battery health scores may apply to other types of vehicles and/or types of batteries that may be found in vehicles as well (e.g., hybrid and internal combustion engine vehicles). In conventional practice, individual OEMs may devise their own unique vehicle battery health scores. In doing so, each OEM may measure different parameters and/or a different number of parameters when determining this OEM-specific vehicle battery health score. This may result in difficulties in identifying the relative health of batteries in vehicles from different OEMs because such OEM-specific battery health scores may not be normalized with respect to one another. The systems and methods described herein may rectify this difficulty by using the OEM-specific battery health score as an input along with other parameters, and weighting these inputs to produce a normalized vehicle battery health score that is applicable to any vehicle battery, regardless of OEM. It should be noted that the battery health score may be referred to herein interchangeably as "health score," "vehicle battery health score," and the like, but these terms may refer to the same normalized battery health score described above regardless of any slight differences in the way the term may be phrased.

In some embodiments, the health score of the battery may be useful for a number of reasons, such as providing an estimate of a time to replacement of the battery, providing supplemental information used for valuation of the vehicle (e.g., in resale), or changing the operation of the vehicle in order to prolong the lifetime of the battery, to name a few examples (additional uses for the determined battery health score may be described below with respect to at least FIG. 1). For example, the change in operation may involve limiting the ability of a driver of the vehicle to use the full power of the battery (limiting the aggressiveness of the acceleration, for example), limiting the use of certain auxiliary features of the vehicle, such as air conditioning, playing loud music, etc., or any other operations that may serve to elongate the lifetime of the battery of the vehicle.

The battery health score may be determined by collecting various data inputs associated with the battery from a vehicle and fitting these data inputs to a scale. More particularly, in some instances, this may also involve weighting the various data inputs relative to one another, summing the resulting weighted values, and fitting this summed value to a scale. This final scaled value may represent the vehicle battery health score and may be presented in the form of a numerical indicator that may provide an indication of the relative health of the particular vehicle's battery. However, in some instances the health score may be presented in any number of other forms, such as a textual descriptor and or in the form of a graphical indication. In some instances, the vehicle health score can also be presented in multiple forms, such as a combination of a numerical value, a graphical indication, and/or a textual descriptor.

In some embodiments, determining the normalized vehicle battery health score may begin with obtaining one or more data inputs from a vehicle. The data inputs may include, for example, battery parameters and/or VIN-level vehicle data (e.g., data pertaining to a vehicle identification number (VIN), such as the OEM associated with the vehicle, the model and year of the vehicle, the place of manufacture of the vehicle, the type of battery installed in the vehicle, as well as other data. In some instances, the data inputs may be pre-defined, and the same types of data inputs may be captured from different vehicles regardless of the type of vehicle and/or the vehicle OEM. However, in other instances, the data inputs that are captured from individual vehicles in performing individual vehicle battery health assessments may be unique to particular OEM associated with the vehicle and/or the particular type of vehicle (e.g., make/model/year, type of engine, features of the vehicle, etc.). That is, the data inputs may also be dynamic, depending on the vehicle. These data inputs may also be associated with additional information beyond the data inputs values themselves. In some instances, for example, the additional information may include contextual data and/or one or more offset indicators to provide a frame of reference for the significance of the data input value. The contextual data associated with a data input may include a range of values, including a minimum data input value and a maximum data input value. This range may provide a frame of reference as to the possible range of values that the data input value could potentially be. Additionally, the offset indicator may provide a frame of reference to this potential range of values itself by providing a descriptor that provides insight into the desirability of the data input value relative to the possible range of values. For example, the offset indicator may include a "high," "low," or "range" categorization. A "high" offset indicator may mean that a larger data input value of the data input is more desirable than a lower data input value (e.g., larger numerical value). A "low" offset indicator may mean that a smaller data input value may be more desirable than a high data input value (e.g., smaller numerical value). A "range" offset indicator may mean that it is more desirable for the data input value to be within a given range than outside of the given range. The "desirability" of a value may mean that the value is more representative of a healthier battery (e.g., a battery with a more favorable health score). As a specific example, a data input may include a number of charges the battery has undergone. The contextual data associated with this data input may be a range of values including a minimum number of charges and a maximum number of charges. Additionally, the offset indicator, in this case, may be a "low" designation. For example, if the number of charges range is 0-1000, then a number of charges value of 100 would be more desirable than a number of charges value of 600. This may be the case because the battery may experience a level of degradation with each successive charge it undergoes. It should be noted that although specific numbers and offset indicators are provided in this example, they should not be taken to be limiting. Additionally, any number of other types of data inputs associated with any number of ranges and types of offset indicators may also be applicable.

In some embodiments, the data inputs obtained from a vehicle may include the OEM-determined state of health (SOH). This OEM-determined SOH value may be a non-normalized state of health score determined by the OEM for their own production vehicles using a proprietary or non-proprietary equation or algorithm. As mentioned above, different OEMs may calculate their battery SOH scores using different parameters and/or algorithms, so even if two SOH scores were the same for different OEMs, this may not necessarily mean the batteries have experienced the same level of degradation. Although these may be non-normalized values, they still may provide important information about the state of health of the battery, and may be weighted along with any of the other data inputs illustrated herein. The SOH value may typically be represented as a percentage that falls between 0 and 100%, but may be represented in other forms as well, such as a numeric value. At 0% SOH, the battery may be unusable in any application. The battery may only be at 100% SOH right after it has been manufactured. Generally, the maximum available energy/capacity and impedance may be used in conjunction to assign this SOH value.

In some embodiments, the data inputs may also include depth of discharge (DoD) data. For example, DoD data may include an average percentage DoD, an average DoD ambient temperature, and/or a DoD throughput, which may be measured in kWh. The average percentage depth of discharge may refer to the amount of capacity, starting from full charge, that has been discharged from the battery. It may be the inverse of SOC (described below) and may be calculated by dividing the discharged capacity by the total available capacity. 0% DoD may represent fully charged and 100% may represent fully discharged. The average DoD ambient temperature may be an environmental factor used to capture/calculate the average temperature during discharge cycles. For example, the higher the temperature, the more damage may have been done to the battery. The DoD throughput may refer to the amount of energy in kilowatts hours released during discharge over the lifetime of the battery.

In some embodiments, the data inputs may also include data pertaining to the charging of the battery. For example, the data inputs may include an average charging magnitude, and average charging ambient temperature, and/or a charging throughput, which may be measured in kWh. Additionally, the data inputs may include a total throughput, which also may be measured in kWh. The average charging magnitude may be a measurement pertaining to a magnitude of current experienced by the battery during charging. In some cases, the stronger the current, the more damage is done to the battery. The average charging temperature may be an environmental factor to capture/calculate the average temperature during charging cycles. The charging throughput may be the amount of energy that passed into the vehicle during charging sessions. This may be recorded by a Battery Management System (BMS) of the vehicle. Total throughput may be a measure of the total amount of work that has been performed on the battery. This may be related to mileage on an engine of the vehicle, for example, since it can be used to estimate the amount of "wear and tear" that the battery has endured. This may be calculated in the BMS by accumulating a total watt hours (Whrs) in and out.

In some embodiments, the data inputs may also include data pertaining to the capability of the battery to hold a charge. For example, the data inputs may include a state of charge (SOC) of the battery, an estimated range of the battery at full charge, an estimated range of the battery at a current charge of the battery, and a range of the battery at "birth," which may be the range of the battery before the battery has been used. Additionally, the data inputs may include the battery energy capacity, which may be measured in kWh. The SOC of the battery may refer to the amount of charge that the battery has remaining, for example, represented as a percentage.

In some embodiments, the data inputs may also include data pertaining to the manner in which the battery has been charged over its lifetime. For example, the data inputs may include a number of times the battery has undergone fast charge cycles, the number of times the battery has undergone Level 1 charge cycles (e.g., involving the use of 120V), and/or the number of times the battery has undergone Level 2 charge cycles (e.g., involving the use of 240V). In some instances, the Level 2 charging cycle may involve higher energy throughput and a faster charge, but more energy mass pass through the battery at a higher speed so the impact on the battery may be greater. The number of each of these types of charge cycles may be measured by the BMS of the vehicle.

In some embodiments, the data inputs may also include various other types of inputs, such as a remaining battery energy capacity, a state of capacity, a battery calendar age, a battery cycles age, a charging history, a thermal environment history, and a driving load profile, as well as resistance, current, and voltage data. Remaining battery energy capacity may refer to the remaining available energy storage capacity of the battery. State of capacity may be a remaining available energy storage capacity of the battery. This may involve a correlation of actual and theoretical/optimal scores based on battery age (e.g., which may be a function of battery birth data) and/or based on degradation. The capacity of the battery may be evaluated in KW/hr and may be expressed as a percentage value. The battery capacity may degrade over time and experience a falloff as described herein at around 70% capacity (this value may differ depending on the properties of the battery). The battery calendar age may be a static data point that refers to the amount of time that has elapsed since the battery was manufactured. The battery cycles age may involve correlating actual charging cycles to theoretical/optimal charge cycles based on battery age and utilization (e.g., which may be a function of battery birth data). Charging history may involve information pertaining to how a battery has been charged over its lifetime. For example, the charging history may involve a number and type of charging routines used (e.g., number of Level 1 charge cycles, Level 2 charge cycles, etc.), the temperature involved in each charging cycle, the frequency of charging cycles, etc. The charging history may involve correlating battery temperature readings over a lifetime of the battery to an optimal temperature range. In some instances, telematics may be used to input latitudinal and longitudinal data sets to perform these correlations. For example, the latitudinal and longitudinal data sets may be used to determine an environmental temperature at the location represented by the latitudinal and longitudinal data sets. The driving load profile may correlate actual driving load profile (for example, hard/fast/frequent acceleration, declaration, vertical climbs, etc.) to theoretical/optimal load profiles as a function of load data at battery birth. Finally, resistance, current, and voltage may simply refer to the resistance, current, and voltage of the battery at various points in time. Resistance may be measured in milliohms (mΩ). In some instances, the lower the resistance, the less restriction the battery encounters. Low resistance may result in high current delivery on demand with the battery remaining in a lower temperature state (cooler). High resistance may restrict the amount of current and heat up the battery. It should be noted that although specific type of data inputs may have been described above, these examples are not intended to be limiting and static. Instead, any other number or combination of data inputs may also be used (including data inputs not listed herein).

In some embodiments, multiple sources of information may be leveraged to collect data inputs that may be used to determine the normalized battery health score, including at least visual (e.g., console) and mechanical inspections (e.g., OBD), performance of physical, point in time, and rapid spectrum impedance testing, and using local or external sources to gather BMS, telematics, and CAN bus data. Such battery data may also be compiled for each EV make, model year combination and may be used to develop algorithms to model expected battery degradation over time across each category and subcategory described herein. A single data input may also be obtained in any number of ways. For example, the data input may be obtained through an OEM, obtained through a calculation, etc.

In some embodiments, the data inputs collected for a battery of a particular vehicle may also be compared to data previously collected for batteries and vehicles of similar types. For example, the data collected for a vehicle may be compared to data previously collected for a similar make/model/year of vehicle with a similar battery. The health score may thus partially or entirely depend on comparisons between patterns found in data obtained previously obtained for similar vehicles and data collected for the current battery being scored. These comparisons may be used to predict how the battery has performed and/or will continue to perform in the future, and may also provide insight into how the battery is performing compared to other similar batteries of similar vehicle types (for example, the comparison may indicate that the battery for the vehicle being scored has performed worse than the historical data for such vehicles indicates, so this current battery may be provided a lower than average health score).

In some embodiments, once the relevant data inputs are obtained, the values associated with each of the data inputs may be weighted based on a determined significance of each of the data inputs. For example, as described below with respect to FIG. 1, an OEM state of health data input may be weighted more heavily than a total number of charges data input (this example is not intended to be limiting, and, in some cases, it may also be weighted less heavily). In some instances, all of the weights for all of the data inputs may be different, but in some instances, some of the weight values may be the same between two or more data inputs. Once the weighted values for the data inputs are determined, these weighted values may be summed to determine a total points value to assign the data input. This total points summation may be applied to a scale to determine the final, normalized vehicle battery health score.

In some embodiments, the scale may be based on a maximum total number of points that may be possible for any given set of data inputs for a battery. For example, in one non-limiting example, the scale may be a 190 point scale (e.g., the maximum total number of points after the summation takes place may be 190). The scale that is used may not necessarily be limited to only this particular value example provided herein. The scale may be dependent on a degradation pattern of the battery being used in the vehicle, and properties of batteries may differ. For example, some batteries may experience a falloff at 50% instead of 70%. The summed total points for a given battery may be scaled down based on its value relative to the maximum total number of points. There may also exist a threshold total point in between zero and the maximum total number of points that corresponds to a falloff of the battery health score. In some instances, falloff may refer to a point at which noticeably degradation of the battery takes place. That is, a point where the rate at which the degradation occurs may increase and required replacement of the battery may be imminent. To continue the above non-limiting example, 0-67 total summed points may represent a final, normalized vehicle battery health score between 5.4-3.3, and 68-190 total points may represent a final, normalized vehicle battery health score between 3.2-1. The scale may reflect the degradation patterns of the battery type in question of a specific vehicle. For example, the aforementioned exemplary scale may reflect known characteristics of Lithium Ion batteries where noticeable falloff begins around 70% battery degradation. The scale may be adjusted based on the type of battery and battery chemistry, as well as the degradation pattern of the battery. As new batteries exhibiting different degradation patterns may be introduced, the scale may be adjusted to account for those degradation patterns. For example, while the above example states that Lithium-Ion batteries experience a falloff at around 70%, a different battery may experience falloff at a different percentage, and thus a different scale may be used.

Turning to the figures, FIG. 1 depicts an example process 100 for establishing a vehicle battery health score that is objectively normalized (e.g., across different OEMs and vehicles). The process 100 may begin at step 105 with one or more data inputs 110 being acquired from a vehicle 101. In some embodiments, the vehicle may include at least one or more batteries 102 (which may be referred to hereinafter as a "battery" for simplicity) and one or more data sources 104. Some or all of the one or more data sources 104 may be connected through a CAN bus 106. The one or more data sources 104, for example, may include a Battery Management System (BMS). These multiple data sources 104 may be leveraged to collect the data inputs 110 from the vehicle 101. Additionally, data inputs 110 may be obtained using, for example, visual (e.g., console) and mechanical inspections (e.g., OBD), performance of physical, point in time, and rapid spectrum impedance testing, among other methods. It may be desirable to acquire the entire history of the vehicle's 101 data. That is, it may be desirable to obtain all of the data associated with the vehicle's battery from its origin to the time at which the data is obtained. However, in some instances, a vehicle OEM may only allow aggregated data to be obtained from the vehicle 101 rather than the entire history of the data. Additionally, in some instances access to different types of data inputs may vary. That is, historical data may be obtained for some data inputs whereas others are only capable of being captured in an aggregate form. The format of a particular data input 110 may depend on the source of the data. For example, OBDII/CAN format may include a standard DBC file numeric data.

In some embodiments, FIG. 1 may depict two example data inputs 110 that may have been obtained from the vehicle 101, including an OEM battery state of health (SOH) and a number of charges. Although FIG. 1 may only depict these two example data inputs 110, it should be noted that any other number and/or combination of data inputs 110 may also be captured from a vehicle 101. Examples of such data inputs 110 may be found in FIG. 3, as described below. As described above, the OEM battery state of health (SOH) may refer to a battery state of the health value that was determined based on OEM-specific algorithms. That is, each OEM may have a unique algorithm for determining a state of health value, so state of health values for different OEMs may not necessarily be comparable. The number of charges may refer to the number of charges that the battery 102 of the vehicle 101 has undergone in its lifetime. For example, the performance and lifetime of the battery 102 may degrade as the number of charges undergone by the battery 102 increases. Each of the data inputs 110 may be associated with a data value 112. For example, the data value 112 for the OEM state of health data input 110 in this particular example may be 94.5, and the data value 112 for the number of charges data input 110 may be 785.

In some embodiments, each of the data inputs 110 may be associated with additional information beyond the data values 112 themselves. For example, the data inputs 110 may be associated with a particular range of values that the values 112 of the data inputs 110 may fall within. Accordingly, the range of values may include a minimum value 114 and a maximum value 115. For example, as depicted in the figure, the OEM state of health data input 110 may be associated with a minimum value 114 of 70 and a maximum value 115 of 100. Likewise, the number of charges data input 110 may be associated with a minimum value 114 of zero and a maximum value 115 of 900. This may mean that the data value 112 of the OEM state of health may be any data value 112 between 70 and 100, and the data value 112 of the number of charges may be any data value 112 between 0 and 900. Thus, the ranges applicable to different data inputs 110 may not necessarily be the same, although some may be the same.

In some instances, the additional information may also include an offset identifier 116. The offset identifier 116 may provide a frame of reference for the significance of the data value 112 of a data input 110. The offset identifier 116 may do so through the use of one or more of several different categorizations, such as "high," "low," and/or "range." A "high" offset identifier 116 may indicate that a larger data value 112 is more desirable for a data input 110. For example, for the OEM state of health data input 110, the range may be depicted as being between 70 and 100 and the offset identifier 116 may be depicted as "high." This may mean that a data value 112 of 95 may be more desirable than a value of 75. A data value 112 being more desirable may mean that it is indicative of a better state of health for the battery of the vehicle 101. A "low" offset identifier 116 may indicate that a smaller data value 112 is more desirable for a data input 110. For example, the number of charges data input 110 may include a value range of 0 to 900 and a "low" offset indicator 116. This may mean that a lower data value 112 may be more desirable for the number of charges data input 110. Thus, a value of 100 would be more desirable than a value of 800. To provide some context, this may be the case because, as described above the performance and lifetime of the battery may degrade as the battery undergoes successive charges. A "range" offset identifier may indicate that it is desirable for a data value 112 of a data input 110 to fall within a particular range of values. For example, a data input 110 may be associated with a minimum value 114 of 0, a maximum value 115 of 50, and an offset indicator range of 40-50. Thus, more weight may be afforded to the data value 112 being either inside or outside of this range of 40-50 than to the data value 112 itself. It should be noted that while offset identifiers 116 of "high," "low," and "range" are described herein, any other offset identifier 116 may also be applicable based on the type of data input 110 in question.

In some embodiments, subsequent to obtaining the data inputs 110 in step 105, the process 100 may proceed to steps 120, 126, 128, and 130 where the data inputs 110 may be fit to a scale to produce the normalized vehicle battery health score. The steps of fitting the data inputs 110 to a scale may begin with converting the data values 112 of the data inputs 110 to weighted total point values at step 120. The data values 112 of the data inputs 110 may be weighted according to a pre-determined importance of each of the data inputs 110 relative to one another. For example, the weights may be chosen based on the amount of impact a particular data input 110 may have on battery degradation. For example, as depicted in FIG. 1, the OEM state of health data value 112 may be weighted more heavily relative to the number of charges data value 112 (e.g., the OEM state of health data value 112 may have a weight value 122 of 0.88, whereas the number of charges data value 112 may only have a weight value 122 of 0.11). It should be noted that the specific weight values 112 depicted in FIG. 1 are merely exemplary and are not intended to be limiting. With these weight values 112 taken as inputs, the following equation (Equation 1) may be used to fit the values 112 of the data inputs to scale.

$$WeightedAvg = \left(\left(\frac{(limitMin - limitMax)(valueIn - baseMax)}{baseMax - baseMin}\right) + limitMin\right)$$ (Equation 1)

In Equation 1, LimitMin may be 0, ValueIn may be the data value 112 of the data input 110, BaseMax may be the maximum range 115 value of the data input 110, BaseMin may be the minimum range 114 value of the data input 110, and LimitMax may a point value that is a certain percentage of the total points that may be possible in the scale, where the certain percentage is based on a known state of health percentage that corresponds to a falloff of the battery health. In some embodiments, the output of Equation 1 may include an assigned points value 125 for each of the data inputs 110. For example, the output of Equation 1 for the OEM state of health data value 112 may be an assigned points value 125 of 9.77 and the output of Equation 1 for the number of charges data value 112 may be an assigned points value 125 of 3.488. At step 126, these assigned points values 125 may be summed to result in a total point value 127. For example, the total point value depicted in FIG. 1 may be 13. This total point value 127 may be out of a maximum possible total number of points for the scale. As one particular example, the maximum possible total number of points for the scale may be 190. Additionally, within this maximum total number of points may exist in one or more threshold ranges. Continuing the same example, a first range may include total point values 127 of 0-67 and a second range may include total point values 127 of 68-190. In this particular example, the total point value of 67 may represent a threshold number beyond which the performance of the battery experience a performance falloff. For example, total point values 127 under 67 may indicate that a battery has not yet experienced a falloff, and total point values 127 over 67 may indicate that the battery has experienced a falloff in performance That is, in this particular example a lower total point value 127 may reflect a better vehicle battery health score than a higher total points value 127. However, the opposite may also apply as well in some scales (e.g., a higher point value may be more desirable in some scales). In some embodiments, at step 128, the total point value 127 obtained in step 126 may be scaled down.

In some embodiments, the process 100 may complete with step 130, which may include providing a finalized state of health score 132 for the battery of the vehicle 101. For example, the process 100 depicts a finalized state of health score 132 of 4.9 for the battery of the vehicle 101. This finalized state of health score 132 may represent a normalized battery state of health score that may be applicable to any vehicle OEM. In addition to providing the finalized state of health score 132, additional information may be provided regarding the health of the battery at step 130. For example, a descriptive grade 133 may also be provided. The descriptive grade 113 may categorize the battery of the vehicle 101 based on the finalized state of health score 132 that is determined. For example, the descriptive grade 133 for the battery of the vehicle 101 as depicted in process 100 is "great" based on the finalized state of health score 132 of 4.9. This descriptive grade 133 is merely exemplary, and any other descriptive grade 133 may be applicable as well.

In some embodiments, once determined, the finalized state of health score 132 may then be used for various purposes. Some examples of such purposes may be described below. One example purpose may be to provide supplemental information for use in a used vehicle transaction. For example, the finalized state of health score 132 may be used as an additional data point for a consumer vehicle sale or purchase in both online vehicle listings and local dealership inventory, including trade-in value determinations. The finalized state of health score 132 may similarly be used as a data point in wholesale vehicle transactions and vehicle auctions as well. The finalized state of health score 132 may also be used by vehicle health reporting services that a consumer may use to obtain a full history of the vehicle before making a purchasing decision. Additionally, the finalized state of health score 132 may be used by third parties, such as insurance companies and financing institutions, in making determinations as to rates to provide to consumers.

In some embodiments, a second example use of the finalized state of health score 132 may involve adjusting features of the vehicle 101 based on the determined finalized state of health score. For example, if the finalized state of health score 132 falls below a threshold state of health, the vehicle's horsepower output may be reduced so as to prolong the lifetime of the battery. Numerous other vehicle features may be adjusted and/or deactivated, however. Some additional non-limiting examples may include the heating, ventilation, and air conditioning (HVAC) system of the vehicle, mobile device charging and connectivity features, radio usage, etc. These adjustments and/or deactivations may be performed by the vehicle 101 automatically or may be provided as options to a user of the vehicle. In the latter scenario, the user may manually select some or all of the adjustments and/or deactivations for the vehicle 101 to perform to extend the lifetime of the battery. Furthermore, rather than the vehicle performing the adjustments (e.g., automatically or based on user selection), the adjustments and/or deactivations may be provided to the user as notifications so that the user themselves can make the adjustments and/or deactivations. For example, the vehicle 101 may provide a notification of the finalized state of health score 132 and the user should turn off certain features of the vehicle to conserve battery life.

In some embodiments, a third example use of the finalized state of health score 132 may involve providing information about a vehicle to an owner and/or third-party for maintenance purposes. For example, a fleet manager may use the finalized state of health score 132 for individual vehicles in the fleet to determine if the vehicles should be kept and fixed, sold, etc. The finalized state of health score 132 may also be used by repair shops in making determinations as to what maintenance needs to be performed on the vehicle 101.

In some embodiments, a fourth example use of the finalized state of health score 132 may involve providing information to third-parties that may desire to know the potential second life of the battery. For example, the finalized state of health score 132 may be provided to battery remanufacturers, storage companies, and/or recyclers. The finalized state of health score 132 may be used by these third-parties to determine the likelihood that the battery of the vehicle 101 may be used for these purposes.

Illustrative System Architecture

Figure 2:
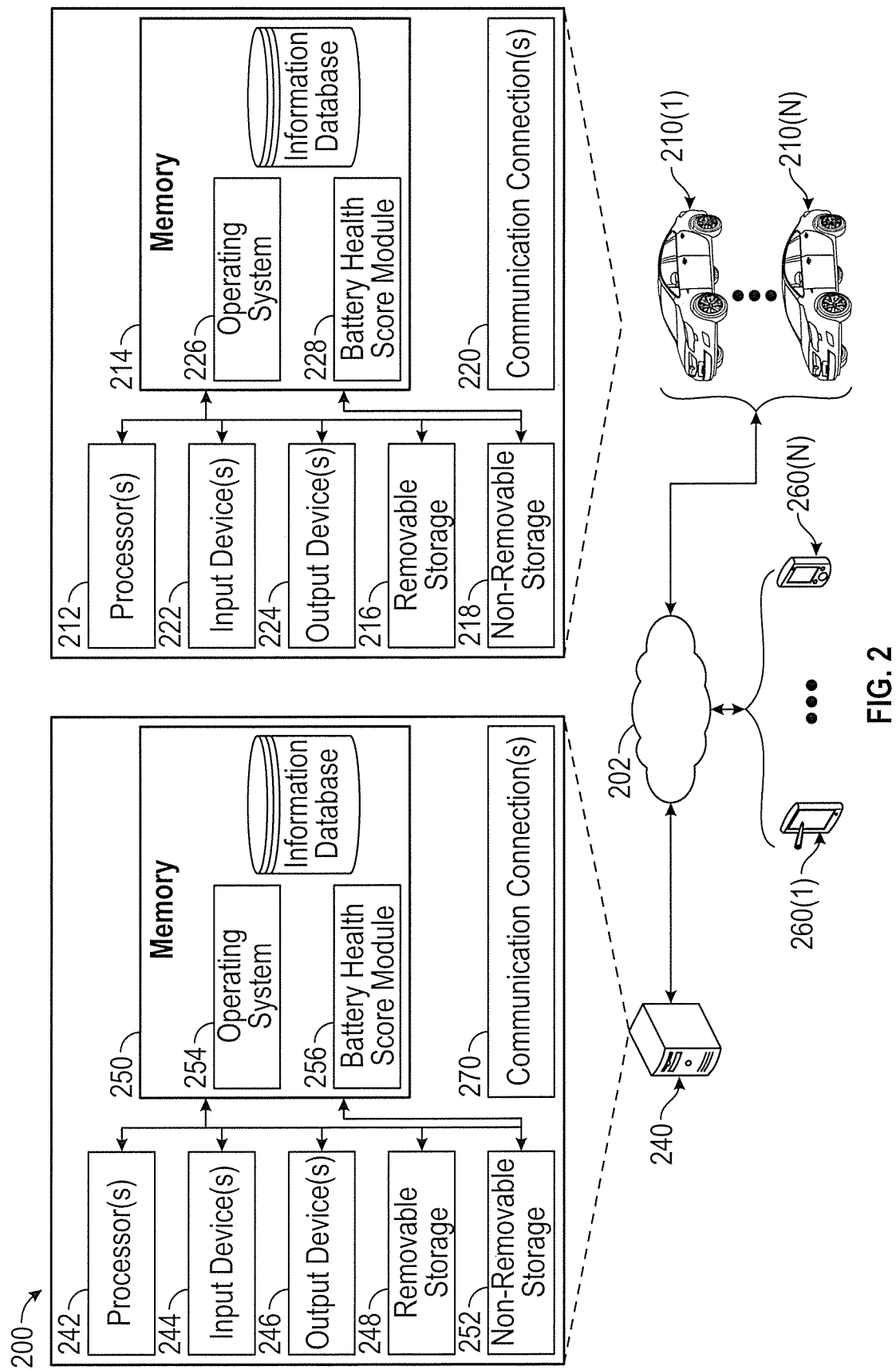
FIG. 2 depicts an illustrative system architecture, in accordance with one or more example embodiments of the disclosure.

FIG. 2 is a schematic illustration of an example vehicle battery health determination system 200 in accordance with one or more example embodiments of the disclosure.

As shown in FIG. 2, the battery health determination system 200 may include at least one or more vehicles 210(1), . . . , 210(N), one or more mobile devices 260(1), . . . , 260(N), and/or a server 240. The one or more vehicles 210(1), . . . , 210(N) (which may be referred to as "vehicle" hereinafter for simplicity) may be the same as the vehicle 101 described with respect to FIG. 1 above, as well as any other vehicle described herein. The one or more mobile devices 260(1), . . . , 260(N) may be portable devices that may alternatively be used to perform any of the operations described herein (e.g., determining the vehicle battery health score). The server 240 may be a remote computing device that is also capable of performing any of the operations described herein.

In some embodiments, communications between a vehicle 210, a mobile device 260, and the server 240 may be performed via one or more networks 202, which may be wireless or wired networks. The one or more networks 202 may include, but not limited to, any one of a combination of different types of suitable communications networks such as, for example, broadcasting networks, cable networks, public networks (e.g., the Internet), private networks, wireless networks, cellular networks, or any other suitable private and/or public networks. Further, the one or more networks may have any suitable communication range associated therewith and may include, for example, global networks (e.g., the Internet), metropolitan area networks (MANs), wide area networks (WANs), local area networks (LANs), or personal area networks (PANs). In addition, the one or more networks may include any type of medium over which network traffic may be carried including, but not limited to, coaxial cable, twisted-pair wire, optical fiber, a hybrid fiber coaxial (HFC) medium, microwave terrestrial transceivers, radio frequency communication mediums, white space communication mediums, ultra-high frequency communication mediums, satellite communication mediums, or any combination thereof.

In an illustrative configuration, a vehicle 210 may be any type of vehicle (e.g., electric vehicle, hybrid vehicle, a vehicle with an internal combustion engine, etc.). The vehicle 210 may include one or more batteries, for which a battery health score may be determined as described herein. The vehicle 210 may also include at least a memory 214 and one or more processing units (or processors) 212. The processors 212 may be implemented as appropriate in hardware, software, firmware, or combinations thereof. Software or firmware implementations of the processors 212 may include computer-executable or machine-executable instructions written in any suitable programming language to perform the various functions described.

The memory 214 may store program instructions that are loadable and executable on the processors 212, as well as data generated during the execution of these programs. Depending on the configuration and type of the vehicle 210, the memory 214 may be volatile (such as random access memory (RAM)) and/or non-volatile (such as read-only memory (ROM), flash memory, etc.). The vehicle 210 or server may also include additional removable storage 216 and/or non-removable storage 218 including, but not limited to, magnetic storage, optical disks, and/or tape storage. The disk drives and their associated computer-readable media may provide non-volatile storage of computer-readable instructions, data structures, program modules, and other data for the vehicles. In some implementations, the memory 214 may include multiple different types of memory, such as static random access memory (SRAM), dynamic random access memory (DRAM), or ROM.

The memory 214, the removable storage 216, and the non-removable storage 218 may be all examples of computer-readable storage media. For example, computer-readable storage media may include volatile and non-volatile, removable and non-removable media implemented in any method or technology for the storage of information such as computer-readable instructions, data structures, program modules, or other data. The memory 214, the removable storage 216, and the non-removable storage 218 may be all examples of computer storage media. Additional types of computer storage media that may be present include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the desired information and which can be accessed by the vehicle 210 or other vehicles. Combinations of any of the above should also be included within the scope of computer-readable media.

Alternatively, computer-readable communication media may include computer-readable instructions, program modules, or other data transmitted within a data signal, such as a carrier wave, or other transmissions. However, as used herein, computer-readable storage media does not include computer-readable communication media.

The vehicle 210 may also contain communication connection(s) 220 that allows the vehicle 210 to communicate with a stored database, another vehicle or server, user terminals, and/or other devices on a network. The vehicle 210 may also include input device(s) 222 such and output device(s) 224, such as a human-machine interface (HMI).

Turning to the contents of the memory 214 in more detail, the memory 214 may include an operating system 226 and one or more application programs or services for implementing the features disclosed herein, including a battery health score module 228.

The battery health score module 228, including computer-executable instructions, code, or the like that responsive to execution by one or more of the processor(s) 212, may perform operations including, but not limited to, collecting and/or making available any of the data inputs (e.g., data inputs 302 or any other data inputs) for the server 240 and/or the mobile device 260 to determine the vehicle battery health score. In some instances, the vehicle may perform the vehicle battery health score determinations itself as well.

Referring now to other illustrative components depicted in FIG. 2, the server 240 may be configured to communicate with the vehicle 210 and may be configured to perform any of the operations described herein. For example, instead of performing the vehicle battery health score determinations at the vehicle itself, such determinations may be performed remotely at the server 240.

In some embodiments, the server 240 may include some similar elements as the vehicle 210. The server 240 may include at least a memory 250 and one or more processing units (or processors) 242. The processors 242 may be implemented as appropriate in hardware, software, firmware, or combinations thereof. Software or firmware implementations of the processors 242 may include computer-executable or machine-executable instructions written in any suitable programming language to perform the various functions described.

The memory 250 may store program instructions that are loadable and executable on the processors 242, as well as data generated during the execution of these programs. Depending on the configuration and type of the server 240, the memory 250 may be volatile (such as random access memory (RAM)) and/or non-volatile (such as read-only memory (ROM), flash memory, etc.). The server 240 may also include additional removable storage 248 and/or non-removable storage 252 including, but not limited to, magnetic storage, optical disks, and/or tape storage. The disk drives and their associated computer-readable media may provide non-volatile storage of computer-readable instructions, data structures, program modules, and other data for the vehicles. In some implementations, the memory 250 may include multiple different types of memory, such as static random access memory (SRAM), dynamic random access memory (DRAM), or ROM.

The memory 250, the removable storage 248, and the non-removable storage 252 may be all examples of computer-readable storage media. For example, computer-readable storage media may include volatile and non-volatile, removable and non-removable media implemented in any method or technology for the storage of information such as computer-readable instructions, data structures, program modules, or other data. The memory 250, the removable storage 248, and the non-removable storage 252 may be all examples of computer storage media. Additional types of computer storage media that may be present include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the desired information and which can be accessed by the server 240 or other vehicles. Combinations of any of the above should also be included within the scope of computer-readable media.

Alternatively, computer-readable communication media may include computer-readable instructions, program modules, or other data transmitted within a data signal, such as a carrier wave, or other transmissions. However, as used herein, computer-readable storage media does not include computer-readable communication media.

The server 240 may also contain communication connection(s) 270 that may allow the server 240 to communicate with a stored database, another vehicle or server, user terminals, and/or other devices on a network. The server 240 may also include input device(s) 244 such as a keyboard, a mouse, a pen, a voice input device, a touch input device, etc., and output device(s) 246, such as a display, speakers, printers, etc.

Turning to the contents of the memory 250 in more detail, the memory 250 may include an operating system 254 and one or more application programs or services for implementing the features disclosed herein, including a battery health score module 256. In some instances, the battery health score module 256 may be configured to perform the same or similar operations as the battery health score module 228 described above with respect to the vehicle 210.

In some embodiments, a mobile device(s) 260(1)-260(N) may be a wireless device that may also be used instead of the vehicle 210 and/or the server 240 to perform any of the operations described herein. That is, the data inputs described herein (e.g., data inputs 302 as well as any other data inputs) may be collected from the vehicle 210 and provided to the mobile device 260 to perform the vehicle battery health score determination as an alternative to the server 240 determining the vehicle battery health score. For example, the mobile device 260 may be a mobile telephone (such as a smartphone), a tablet computer, a wearable, a laptop computer, etc. The mobile device 260 may also have similar components as the vehicle 210 and/or the server 240, including at least one or more processors, inputs devices, output devices, removable storage, non-removable storage, communication connections, and memory, the memory including one or more operating systems, an information database, and a battery health score module.

Program modules, applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language, such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database task or search language, or a report writing language. In one or more example embodiments, a software component comprising instructions in one of the foregoing examples of programming languages may be executed directly by an operating system or other software components without having to be first transformed into another form.

A software component may be stored as a file or other data storage construct. Software components of a similar type or functionally related may be stored together, such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines, and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program modules, or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Illustrative Data Inputs

FIG. 3 illustrates exemplary data inputs 302 that may be used to determine a normalized vehicle battery health score. For example, the data inputs 302 illustrated in the figure may be the same as the data inputs 110 described with respect to FIG. 1, as well as any other data inputs described herein. One example data input 302 may include an OEM-determined state of health (SOH). This OEM-determined SOH value may be a non-normalized state of health score determined by the OEM for their own production vehicles using a proprietary or non-proprietary equation of algorithm. As mentioned above, different OEMs may calculate their battery SOH scores using different parameters and/or algorithms, so even if two SOH scores were the same for different OEMs, this may not necessarily mean the batteries have experienced the same level of degradation. Although these may be non-normalized values, they still may provide important information about the state of health of the battery, and may be weighted along with any of the other data inputs illustrated herein. The SOH value may typically be represented as a percentage that falls between 0 and 100%, but may be represented in other forms as well, such as a numeric value. At 0% SOH, the battery may be unusable in any application. The battery may only be at 100% SOH right after it has been manufactured. Generally, the maximum available energy/capacity and impedance may be used in conjunction to assign this SOH value.

In some embodiments, the data inputs 302 may also include depth of discharge (DoD) data. For example, DoD data may include an average percentage DoD, an average DoD ambient temperature, and/or a DoD throughput, which may be measured in kWh. The average percentage depth of discharge may refer to the amount of capacity, starting from full charge, that has been discharged from the battery. It may be the inverse of SOC (described below) and may be calculated by dividing the discharged capacity by the total available capacity. 0% DoD may represent fully charged and 100% may represent fully discharged. The average DoD ambient temperature may be an environmental factor used to capture/calculate the average temperature during discharge cycles. For example, the higher the temperature, the more damage may have been done to the battery. The DoD throughput may refer to the amount of energy in kilowatts hours released during discharge over the lifetime of the battery.

In some embodiments, the data inputs 302 may also include data pertaining to the charging of the battery. For example, the data inputs 302 may include an average charging magnitude, and average charging ambient temperature, and/or a charging throughput, which may be measured in kWh. Additionally, the data inputs 302 may include a total throughput, which also may be measured in kWh. The average charging magnitude may be a measurement pertaining to a magnitude of current experienced by the battery during charging. In some cases, the stronger the current, the more damage is done to the battery. The average charging temperature may be an environmental factor to capture/calculate the average temperature during charging cycles. The charging throughput may be the amount of energy that passed into the vehicle during charging sessions. This may be recorded by a Battery Management System (BMS) of the vehicle. Total throughput may be a measure of the total amount of work that has been performed on the battery. This may be related to mileage on an engine of the vehicle, for example, since it can be used to estimate the amount of "wear and tear" that the battery has endured. This may be calculated in the BMS by accumulating a total watt hours (Whrs) in and out.

In some embodiments, the data inputs 302 may also include data pertaining to the capability of the battery to hold a charge. For example, the data inputs 302 may include a state of charge (SOC) of the battery, an estimated range of the battery at full charge, an estimated range of the battery at a current charge of the battery, and a range of the battery at "birth," which may be the range of the battery before the battery has been used. Additionally, the data inputs 302 may include the battery energy capacity, which may be measured in kWh. The SOC of the battery may refer to the amount of charge that the battery has remaining, for example, represented as a percentage.

In some embodiments, the data inputs 302 may also include data pertaining to the manner in which the battery has been charged over its lifetime. For example, the data inputs 302 may include a number of times the battery has undergone fast charge cycles, the number of times the battery has undergone Level 1 charge cycles (e.g., involving the use of 120V), and/or the number of times the battery has undergone Level 2 charge cycles (e.g., involving the use of 240V). In some instances, the Level 2 charging cycle may involve higher energy throughput and a faster charge, but more energy mass pass through the battery at a higher speed so the impact on the battery may be greater. The number of each of these types of charge cycles may be measured by the BMS of the vehicle.

In some embodiments, the data inputs 302 may also include various other types of inputs, such as a remaining battery energy capacity, a state of capacity, a battery calendar age, a battery cycles age, a charging history, a thermal environment history, and a driving load profile, as well as resistance, current, and voltage data. Remaining battery energy capacity may refer to the remaining available energy storage capacity of the battery. State of capacity may be a remaining available energy storage capacity of the battery. This may involve a correlation of actual and theoretical/optimal scores based on battery age (e.g., which may be a function of battery birth data) and/or based on degradation. The capacity of the battery may be evaluated in KW/hr and may be expressed as a percentage value. The battery capacity may degrade over time and experience a falloff as described herein at around 70% capacity (this value may differ depending on the properties of the battery). The battery calendar age may be a static data point that refers to the amount of time that has elapsed since the battery was manufactured. The battery cycles age may involve correlating actual charging cycles to theoretical/optimal charge cycles based on battery age and utilization (e.g., which may be function of battery birth data). Charging history may involve information pertaining to how a battery has been charged over its lifetime. For example, the charging history may involve a number and type of charging routines used (e.g., number of Level 1 charge cycles, Level 2 charge cycles, etc), the temperature involved in each charging cycle, the frequency of charging cycles, etc. The charging history may involve correlating battery temperature readings over a lifetime of the battery to an optimal temperature range. In some instances, telematics may be used to input latitudinal and longitudinal data sets to perform these correlations. For example, the latitudinal and longitudinal data sets may be used to determine an environmental temperature at the location represented by the latitudinal and longitudinal data sets. The driving load profile may correlate actual driving load profile (i.e., hard/fast/frequent acceleration, declaration, vertical climbs, etc.) to theoretical/optimal load profiles as a function of load data at battery birth. Finally, resistance, current, and voltage may simply refer to the resistance, current, and voltage of the battery at various points in time. Resistance may be measured in milliohms (mΩ). In some instances, the lower the resistance, the less restriction the battery encounters. Low resistance may result in high current delivery on demand with the battery remaining in a lower temperature state (cooler). High resistance may restrict the amount of current and heat up the battery. It should be noted that although specific type of data inputs 302 may have been described above, these examples are not intended to be limiting and static. Instead, any other number or combination of data inputs 302 may also be used (including data inputs not listed herein).

In addition to presenting the data inputs 302 themselves, FIG. 3 may also illustrate example additional information that may be associated with the data inputs 302. For example, the minimum potential value 304, maximum potential value 306, and/or offset indicator 308 may also be provided. Furthermore, exemplary sources 303 from which the data inputs 302 and any additional information may be obtained may be provided as well. For example, the OEM SOH, total throughput, SOC, estimated range at full charge, estimated range at current charge, battery energy capacity, number of fast charge cycles, number of L1 charge cycles, and/or number of L2 charge cycles may be obtained from the vehicle's battery management system (BMS). Additionally, the DOD data, average charging magnitude, average charging ambient temperature, charging throughput, and the range of the battery at birth may be OEM determined. That is, the information may be predetermined by the OEM that manufactures the particular vehicle. Although these exemplary sources for the above-described data inputs 302 have been provided, it should be noted that these are not intended to be limiting, and the data inputs 302 may be obtained from any number of different types of sources as well. For example, the data inputs 302 may include any other type of data. Additionally, any minimum potential value 304, maximum potential value 306, offset indicator 308, and/or any other information associated with any data inputs 302 depicted in FIG. 3 may be different than the values actually depicted in the figure. These values depicted in the figure may simply be exemplary.

Illustrative Methods

Figure 4:
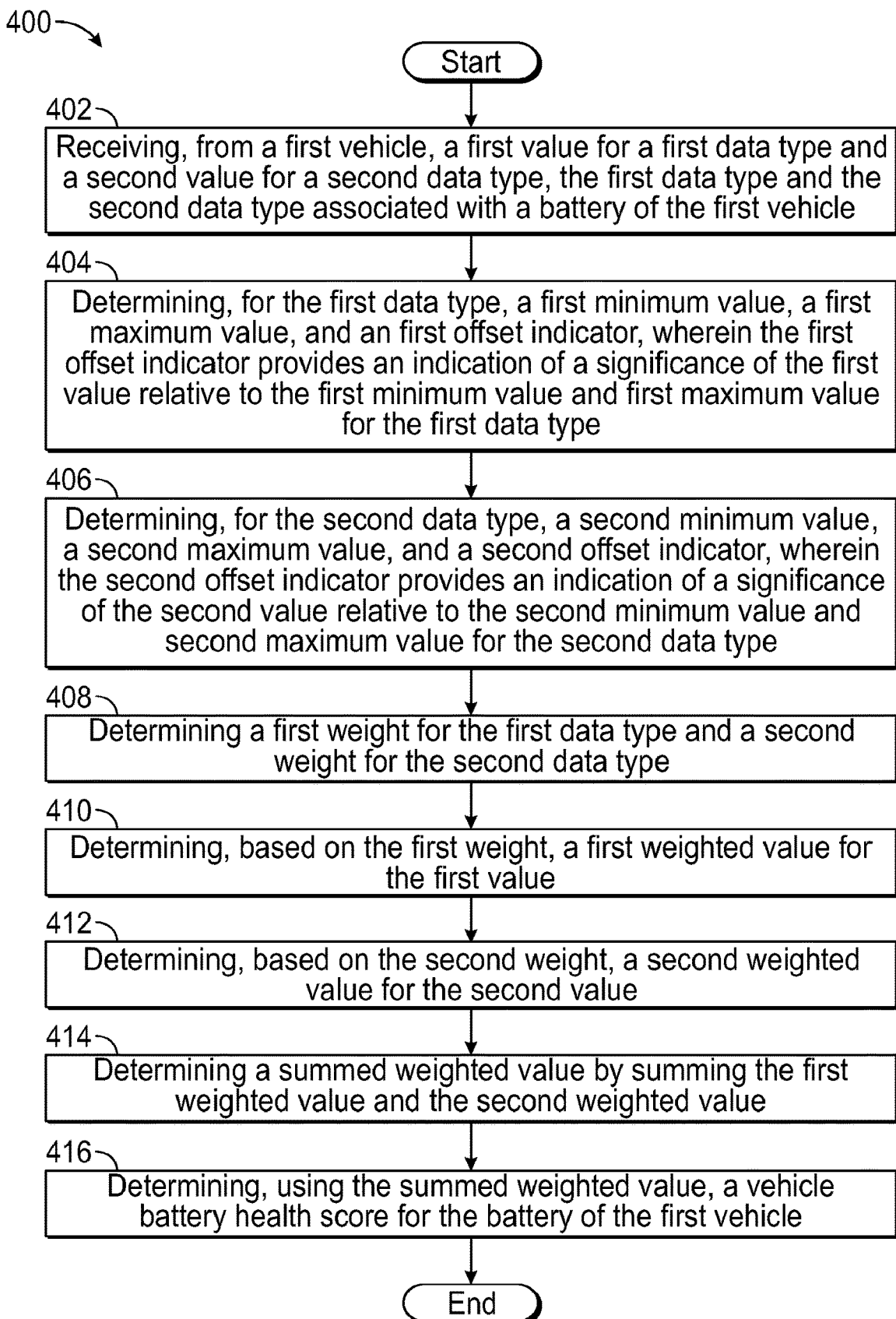
FIG. 4 depicts a flowchart of an example method, in accordance with one or more example embodiments of the disclosure.

FIG. 4 is an example method 400 for determining a normalized battery health score in accordance with one or more example embodiments of the disclosure. In FIG. 4, computer-executable instructions of one or more module(s) of the vehicle 210, the mobile device 260, and/or the server 240 may be executed to determine a normalized battery health score. At block 402 of the method 400 in FIG. 4, the method may include receiving, from a first vehicle, a first value for a first data type and a second value for a second data type, the first data type and the second data type associated with a battery of the first vehicle. For example, the first data type and/or the second data type may be any of the data inputs described herein, such as any of the data inputs 302 described with respect to FIG. 3 above. The first data type and the second data type may represent two different data inputs that may be obtained from a vehicle. In some embodiments, multiple sources of information may be leveraged to collect battery data, including at least visual (e.g., console) and mechanical inspections (e.g., OBD), performance of physical, point in time, and rapid spectrum impedance testing, and using local or external sources to gather BMS, telematics, and CAN bus data. Such battery data may also be compiled for each EV make, model year combination, and may be used to develop algorithms to model expected battery degradation over time across each category and subcategory described herein.

Block 404 of the method 400 may include determining for the first data type, a first minimum value, a first maximum value, and a first offset indicator, wherein the first offset indicator provides an indication of a significance of the first value relative to the first minimum value and first maximum value for the first data type. This additional information may be the additional information described with respect to FIG. 1, FIG. 3, or any other additional information described herein. That is, the additional information may provide a frame of reference for the value of the first data type and the value of the second data type (e.g., if the value is representative of a healthy battery or a more degraded battery). For example, the minimum possible value and maximum possible value may represent the outer boundaries of ranges that the value for the first data type and the value for the second type can be within respectively. Additionally, the offset indicator may be any of the "high," "low," and/or "range" offset indicators described herein, as well as any other offset indicators.

Block 406 of the method 400 may include determining, for the second data type, a second minimum value, a second maximum value, and a second offset indicator, wherein the second offset indicator provides an indication of a significance of the second value relative to the second minimum value and second maximum value for the second data type.

Block 408 of the method 400 may include determining a first weight for the first data type and a second weight for the second data type. Block 410 of the method 400 may include determining, based on the first weight, a first weighted value for the first value. Block 412 of the method 400 may include determining, based on the second weight, a second weighted value for the second value. The weighted value for the first data type and the weighted value for the second data type may be the same as the assigned point values 125 determined in step 120 of the process 100 described with respect to FIG. 1. That is, each of the first data type, the second data type, and any other data inputs obtained may be associated with a predetermined weight relative to other data types.

Block 414 of the method 400 may include determining a summed weighted value by summing the first weighted value and the second weighted value. In some instances, the summed weighted value may be the same as the total point value 127 determined in step 126 of the process 100 described with respect to FIG. 1 above.

Block 416 of the method 400 may include determining, using the summed weighted value, a vehicle battery health score for the battery of the first vehicle. That is, the final vehicle battery health score may be a normalized vehicle battery health score that may be used regardless of the OEM associated with the vehicle.

The operations described and depicted in the illustrative process flows of FIG. 4 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIG. 4 may be performed.

One or more operations of the process flows of FIG. 4 may have been described above as being performed by a user device, or more specifically, by one or more program modules, applications, or the like executing on a device. It should be appreciated, however, that any of the operations of process flows of FIG. 4 may be performed, at least in part, in a distributed manner by one or more other devices, or more specifically, by one or more program modules, applications, or the like executing on such devices. In addition, it should be appreciated that processing performed in response to execution of computer-executable instructions provided as part of an application, program module, or the like may be interchangeably described herein as being performed by the application or the program module itself or by a device on which the application, program module, or the like is executing. While the operations of the process flows of FIG. 4 may be described in the context of the illustrative object tracking system, it should be appreciated that such operations may be implemented in connection with numerous other device configurations.

It should further be appreciated that the server 240 may include alternate and/or additional hardware, software, or firmware components beyond those described or depicted without departing from the scope of the disclosure. More particularly, it should be appreciated that software, firmware, or hardware components depicted as forming part of the server 240 are merely illustrative and that some components may not be present or additional components may be provided in various embodiments. While various illustrative program modules have been depicted and described as software modules stored in data storage, it should be appreciated that functionality described as being supported by the program modules may be enabled by any combination of hardware, software, and/or firmware. It should further be appreciated that each of the above-mentioned modules may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other modules. Further, one or more depicted modules may not be present in certain embodiments, while in other embodiments, additional modules not depicted may be present and may support at least a portion of the described functionality and/or additional functionality. Moreover, while certain modules may be depicted and described as sub-modules of another module, in certain embodiments, such modules may be provided as independent modules or as sub-modules of other modules.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

That which is claimed is:

1. A system comprising:
at least one processor; and
at least one memory storing computer-executable instructions, that when executed by the at least one processor, cause the at least one processor to:
receive, from a first vehicle, a first value for a first data type and a second value for a second data type, the first data type and the second data type associated with a battery of the first vehicle;
determine, for the first data type, a first minimum value, a first maximum value, and a first offset indicator, wherein the first offset indicator provides an indication of a significance of the first value relative to the first minimum value and first maximum value for the first data type;
determine, for the second data type, a second minimum value, a second maximum value, and a second offset indicator, wherein the second offset indicator provides an indication of a significance of the second value relative to the second minimum value and second maximum value for the second data type; and
determine, based on a first weighted value associated with the first data type and a second weighted value associated with the second data type, a vehicle battery health score for the battery of the first vehicle.

2. The system of claim 1, wherein the computer-executable instructions further cause the at least one processor to:
receive, from a second vehicle, a third value for the first data type and a fourth value for the second data type;
determine, based on the weight for the first data type, a weighted value for the third value;
determine, based on the weight for the second data type, a weighted value for the fourth value;
determine a summed weighted value by summing the weighted value for the third value and the weighted value for the fourth value; and
determine, using the summed weighted value, a vehicle battery health score for the battery of the second vehicle, wherein the vehicle battery health score is normalized across the first vehicle and the second vehicle.

3. The system of claim 1, wherein the computer-executable instructions further cause the at least one processor to:
determine, based on the vehicle battery health score, a change in an operational setting of the first vehicle.

4. The system of claim 1, wherein the offset indicator includes at least one of: high, low, or range,
wherein the high offset indicator indicates that a larger value for the first data type or the second data type is associated with a healthier vehicle battery,
wherein the low offset indicator indicates that a smaller value for the first data type or the second data type is associated with a healthier vehicle battery, and
wherein the range offset indicator indicates that a value for the first data type or the second data type that is within the range is associated with a healthier vehicle battery than a value for the first data type or the second data type that is outside the range.

5. The system of claim 1, wherein the value for the first data type and the value for the second data type are obtained from at least impedance testing, mechanical diagnostics, a Battery Management System (BMS) of the first vehicle, a Controller Area Network (CAN) bus of the first vehicle, or telematics data from the first vehicle.

6. The system of claim 1, wherein the first data type comprises at least one of: an OEM state of health value, wherein the OEM state of health value is an OEM-specific value that is not normalized across different OEMs.

7. The system of claim 6, wherein the first data type further comprises at least one of: depth of discharge data, an average charging magnitude, an average charging ambient temperature, a charging throughput, a total throughput, a state of charge, an estimated range at full charge, an estimated range at a current charge, a range of the battery at birth, a battery energy capacity, a number of fast charge cycles, a number of L1 charge cycles, and/or a number of L2 charge cycles.

8. A method comprising:
receiving, from a first vehicle, a first value for a first data type and a second value for a second data type, the first data type and the second data type associated with a battery of the first vehicle;
determining, for the first data type, a first minimum value, a first maximum value, and a first offset indicator, wherein the first offset indicator provides an indication of a significance of the first value relative to the first minimum value and first maximum value for the first data type;
determining, for the second data type, a second minimum value, a second maximum value, and a second offset indicator, wherein the second offset indicator provides an indication of a significance of the second value relative to the second minimum value and second maximum value for the second data type; and
determining, based on a first weighted value associated with the first data type and a second weighted value associated with the second data type, a vehicle battery health score for the battery of the first vehicle.

9. The method of claim 8, further comprising:
receiving, from a second vehicle, a third value for the first data type and a fourth value for the second data type;
determining, based on the weight for the first data type, a weighted value for the third value;
determining, based on the weight for the second data type, a weighted value for the fourth value;
determining a summed weighted value by summing the weighted value for the third value and the weighted value for the fourth value; and
determining, using the summed weighted value, a vehicle battery health score for the battery of the second vehicle, wherein the vehicle battery health score is normalized across the first vehicle and the second vehicle.

10. The method of claim 8, further comprising:
determining, based on the vehicle battery health score, a change in an operational setting of the first vehicle.

11. The method of claim 8, wherein the offset indicator includes at least one of: high, low, or range,
wherein the high offset indicator indicates that a larger value for the first data type or the second data type is associated with a healthier vehicle battery,
wherein the low offset indicator indicates that a smaller value for the first data type or the second data type is associated with a healthier vehicle battery, and
wherein the range offset indicator indicates that a value for the first data type or the second data type that is within the range is associated with a healthier vehicle battery than a value for the first data type or the second data type that is outside the range.

12. The method of claim 8, wherein the value for the first data type and the value for the second data type are obtained from at least impedance testing, mechanical diagnostics, a Battery Management System (BMS) of the first vehicle, a Controller Area Network (CAN) bus of the first vehicle, or telematics data from the first vehicle.

13. The method of claim 8, wherein the first data type comprises at least one of: an OEM state of health value, wherein the OEM state of health value is an OEM-specific value that is not normalized across different OEMs.

14. The method of claim 13, wherein the first data type further comprises at least one of: depth of discharge data, an average charging magnitude, an average charging ambient temperature, a charging throughput, a total throughput, a state of charge, an estimated range at full charge, an estimated range at a current charge, a range of the battery at birth, a battery energy capacity, a number of fast charge cycles, a number of L1 charge cycles, and/or a number of L2 charge cycles.

15. A non-transitory computer readable medium including computer-executable instructions stored thereon, which when executed by one or more processors of a wireless access point, cause the one or more processors to perform operations of:
receiving, from a first vehicle, a first value for a first data type and a second value for a second data type, the first data type and the second data type relating to a battery of the first vehicle;
receiving, from a first vehicle, a first value for a first data type and a second value for a second data type, the first data type and the second data type associated with a battery of the first vehicle;
determining, for the first data type, a first minimum value, a first maximum value, and an first offset indicator, wherein the first offset indicator provides an indication of a significance of the first value relative to the first minimum value and first maximum value for the first data type;
determining, for the second data type, a second minimum value, a second maximum value, and a second offset indicator, wherein the second offset indicator provides an indication of a significance of the second value relative to the second minimum value and second maximum value for the second data type; and
determining, based on a first weighted value associated with the first data type and a second weighted value associated with the second data type, a vehicle battery health score for the battery of the first vehicle.

16. The non-transitory computer readable medium of claim 15, wherein the computer-executable instructions further cause the one or more processors to perform operations of:
receiving, from a second vehicle, a third value for the first data type and a fourth value for the second data type;
determining, based on the weight for the first data type, a weighted value for the third value;
determining, based on the weight for the second data type, a weighted value for the fourth value;
determining a summed weighted value by summing the weighted value for the third value and the weighted value for the fourth value; and
determining, using the summed weighted value, a vehicle battery health score for the battery of the second vehicle, wherein the vehicle battery health score is normalized across the first vehicle and the second vehicle.

17. The non-transitory computer readable medium of claim 15, wherein the computer-executable instructions further cause the one or more processors to perform operations of:
determining, based on the vehicle battery health score, a change in an operational setting of the first vehicle.

18. The non-transitory computer readable medium of claim 15, wherein the offset indicator includes at least one of: high, low, or range,
wherein the high offset indicator indicates that a larger value for the first data type or the second data type is associated with a healthier vehicle battery,
wherein the low offset indicator indicates that a smaller value for the first data type or the second data type is associated with a healthier vehicle battery, and
wherein the range offset indicator indicates that a value for the first data type or the second data type that is within the range is associated with a healthier vehicle battery than a value for the first data type or the second data type that is outside the range.

19. The non-transitory computer readable medium of claim 15, wherein the first data type comprises at least one of: an OEM state of health value, wherein the OEM state of health value is an OEM-specific value that is not normalized across different OEMs.

20. The non-transitory computer readable medium of claim 15, wherein the first data type further comprises at least one of: depth of discharge data, an average charging magnitude, an average charging ambient temperature, a charging throughput, a total throughput, a state of charge, an estimated range at full charge, an estimated range at a current charge, a range of the battery at birth, a battery energy capacity, a number of fast charge cycles, a number of L1 charge cycles, and/or a number of L2 charge cycles.

* * * * *